United States Patent [19]

Ignasiak et al.

[11] Patent Number: 4,768,972
[45] Date of Patent: * Sep. 6, 1988

[54] TEST CLIP FOR PLCC

[75] Inventors: Martin C. Ignasiak, Painesville, Ohio; John N. Tengler, Chico, Calif.; John E. Hartman, Painesville, Ohio

[73] Assignee: Minnesota Mining and Manufacturing Company, St. Paul, Minn.

[*] Notice: The portion of the term of this patent subsequent to Jun. 9, 2004 has been disclaimed.

[21] Appl. No.: 36,064

[22] Filed: Apr. 9, 1987

Related U.S. Application Data

[62] Division of Ser. No. 708,699, Mar. 6, 1985, Pat. No. 4,671,592.

[51] Int. Cl.⁴ .......................................... H01R 13/629
[52] U.S. Cl. ...................................... 439/330; 439/70
[58] Field of Search ............... 339/174, 74 R, 75 M, 339/75 MP, 17 CF; 439/68-75, 264, 265, 269, 330

[56] References Cited

U.S. PATENT DOCUMENTS

| | | | |
|---|---|---|---|
| Re. 28,064 | 7/1974 | Venaleck et al. | 339/174 |
| 3,551,878 | 12/1970 | Rossman | 339/17 CF |
| 3,877,064 | 4/1975 | Scheingold et al. | 339/17 CF |
| 3,914,007 | 10/1975 | Seidler | 339/255 P |
| 4,012,097 | 3/1977 | Long et al. | 339/17 CF |
| 4,116,518 | 9/1978 | Pleskac | 339/17 CF |
| 4,116,519 | 9/1978 | Grabbe et al. | 339/17 CF |
| 4,491,377 | 1/1985 | Pfaff | 339/17 CF |
| 4,536,955 | 8/1985 | Gudgeon | 339/17 CF |
| 4,541,676 | 9/1985 | Hansen et al. | 339/17 CF |
| 4,556,269 | 12/1985 | Anderson et al. | 339/75 M |

FOREIGN PATENT DOCUMENTS

| | | | |
|---|---|---|---|
| 116266 | 8/1984 | European Pat. Off. | 339/75 M |
| 158432 | 10/1985 | European Pat. Off. | |
| 1934752 | 7/1969 | Fed. Rep. of Germany | |

OTHER PUBLICATIONS

RCA Technical Notes, No. 1315, 10/1982, pp. 1–4 Advertisement Entitled "Power Supplies".
Page 13 of ITT Pomona Electronics 1985 Catalog Plastictronics Inc., Brochure: "Chip Carrier Sockets".
J. M. Neg Company Pamphlet: "Neg Chip Carrier Socket for Test and Burn-in of LCC Packages".
Burndy Advertisement: "Burndy, the Leader in DIP Sockets, Introduces a New Socket for Plastic Chip Carriers".

Primary Examiner—John McQuade
Attorney, Agent, or Firm—Renner, Otto, Boisselle & Sklar

[57] ABSTRACT

A test clip for a plastic leaded chip carrier (PLCC) includes a plurality of electrical contacts for electrically connecting with respective leads of the PLCC, an electrically non-conductive body for supporting such contacts in spaced-apart positions, and a retaining mechanism for holding the test clip in operative position with respect to the PLCC. The retaining mechanism includes plural latching arms at respective corners of the test clip and a slide actuator therefor. The slide actuator also is operative to deflect the contacts from a normally open position to a closed position engaging respective leads of the PLCC.

6 Claims, 2 Drawing Sheets

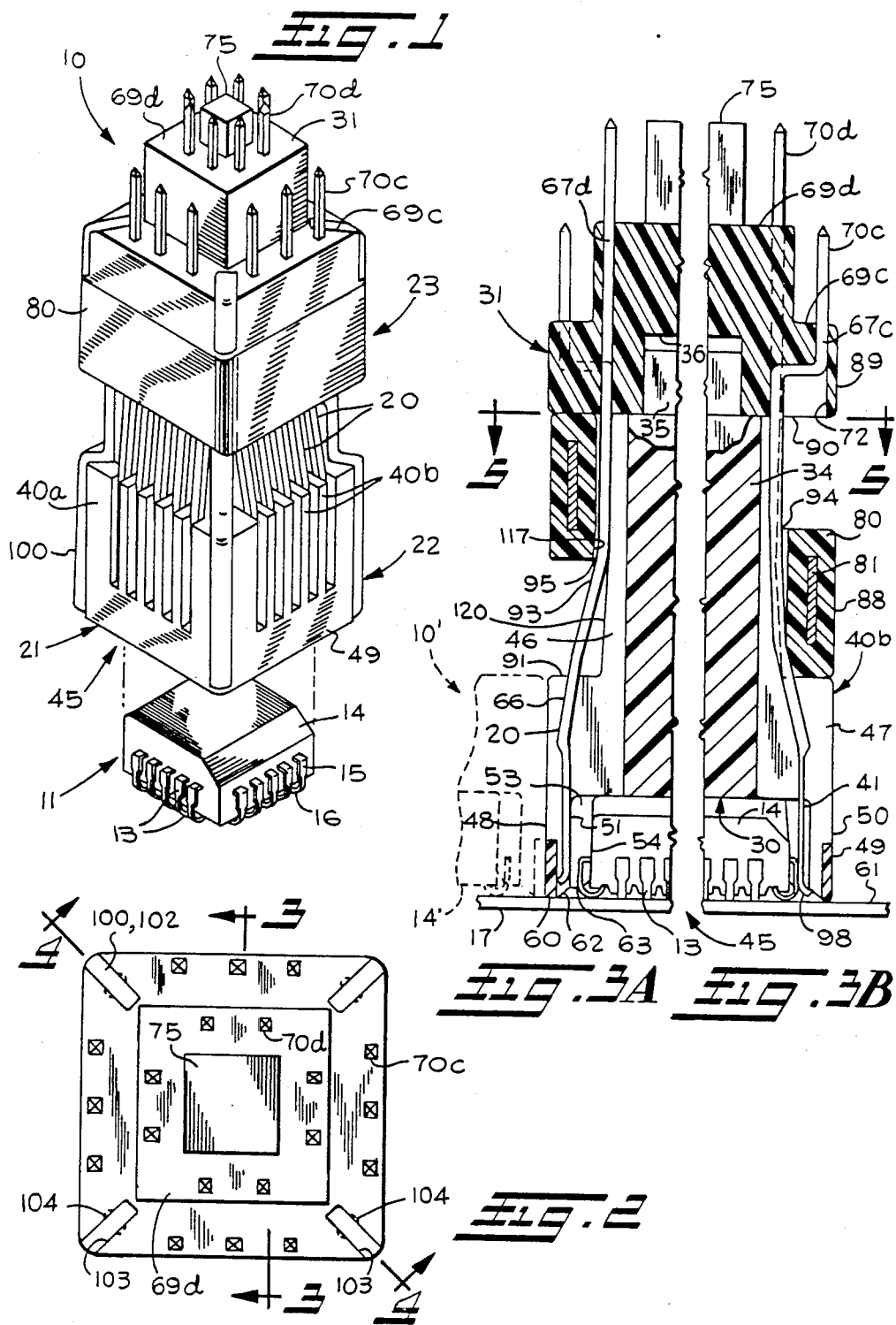

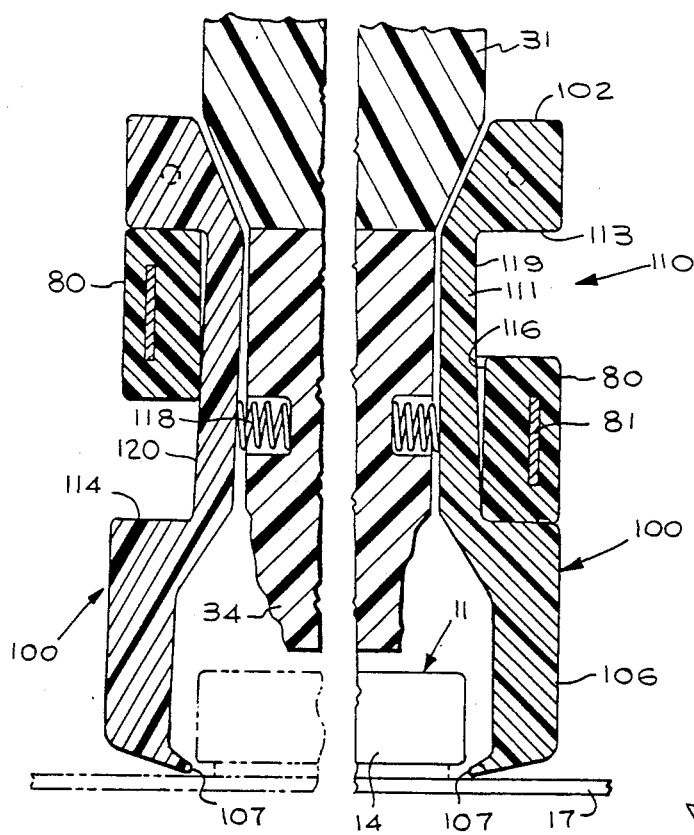
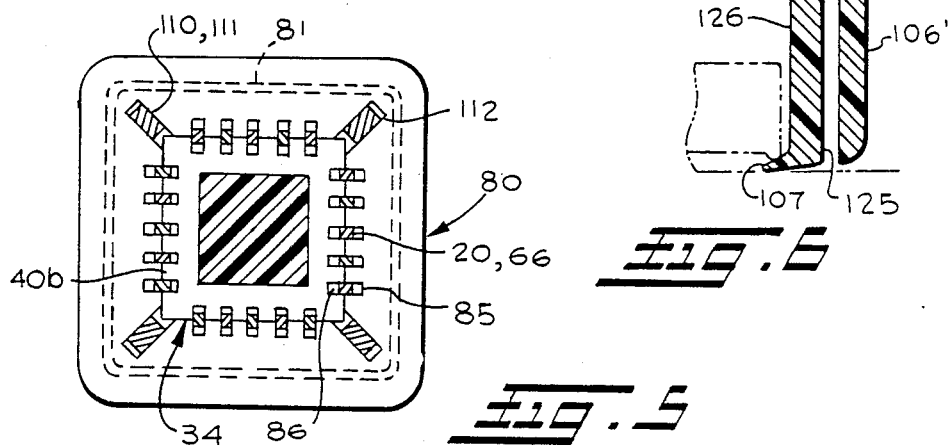

TEST CLIP FOR PLCC

This is a divisional of co-pending application Ser. No. 708,699, filed on Mar. 6, 1985, and now U.S. Pat. No. 4,671,592.

The invention herein disclosed relates generally to clip connectors for electronic devices and, more particularly, to a test clip for use with leaded chip carriers.

BACKGROUND

An example of a prior test clip for electronic devices, such as integrated circuits of the dual-in-line (DIP) package type, is disclosed in U.S. Pat. No. Re. 28,064. The DIP packages may have, for example, a total of from 14 to 64 leads arranged in a pair of parallel rows on the two generally relatively longer parallel sides of the DIP package, and typically the leads are spaced on 0.100 inch centers. The DIP package typically is used by soldering the leads into respective plated-through holes in a printed circuit board or by inserting the leads into a DIP socket already attached to a printed circuit board. For heat dissipation and possibly for other reasons, DIP packages ordinarily are spaced from each other and from other components on a printed circuit board at distances of at least several hundred thousandths inch. The above-mentioned test clip may be used to make electrical connections with each of the leads of a DIP package for signal testing (examination) and/or signal injecting (into the integrated circuit) purposes while the integrated circuit package is in usual mounting and/or use circumstances.

As it is used herein, the term or designation LCC is intended to encompass or to include leaded chip carriers or chip carrier packages that typically consist of one or more circuit chips mounted on a lead frame and encapsulated within an electrically non-conductive encapsulating medium. In one exemplary type the encapsulating medium is of a plastic or plastic-like material—hence the designation PLCC for plastic leaded chip carrier.

An exemplary PLCC is one identified as an "FN plastic chip carrier package" manufactured by Texas Instruments. Such PLCC is of generally square shape in top plan view and may have from 20 to 68 terminals or leads arranged in four equal groups respectively along or proximate to each side of the package. For example, the 20-lead model has five leads per side. The leads are positioned on 0.050 inch (1.27 mm) centers along each side and each lead has a side portion exposed at the side of the package and a bottom portion exposed at the bottom of the package. Such PLCC may be mounted on the surface of a printed circuit board using a soldering technique to attach mechanically and electrically each lead (at the bottom portion thereof) to a respective solder land on the printed circuit board.

Other PLCC's may have, for example, from about 20 to about 124 total leads arranged at or proximate to respective sides of the PLCC. Although the FN PLCC mentioned above has a generally square configuration in plan view, other PLCC's may be of rectangular shape not necessarily square.

Relative to the space and size requirements for a conventional DIP integrated circuit package, in a given space or area a PLCC may have a larger number of circuits and leads or terminals, this being due, at least in part, to the locating of leads along all four sides of the PLCC and the ability to narrow the spacing between leads in a PLCC relative to the wider spacing required in a conventional DIP package. For a number of reasons, such as surface mounting capability, close positioning of leads, and heat producing and/or tolerance characteristics of PLCC's, PLCC's can be mounted on a printed circuit board in relatively closely packed relationship with respectively adjacent PLCC's being spaced apart, for example, by 0.035 inch. Thus, using PLCC's, the capacity, e.g. in number of circuits, memory, etc. of a printed circuit board of a given size ordinarily would be larger than the capacity of such a printed circuit board employing conventional DIP integrated circuits.

As with DIP integrated circuit packages, it would be desirable to have a test clip that may be used to make electrical connections with each of the leads of the PLCC for signal testing and/or signal injecting purposes especially while the PLCC is in usual mounting and/or use circumstances. Because the leads are located along each of the four sides of the PLCC, prior test clips for DIP packages generally could not be used effectively even if appropriately sized since they would permit electrical connections with leads at only two opposed sides of the PLCC. There also may be a problem with interference between such prior test clips and an adjacent PLCC spaced, say 0.035 inch, from the PLCC to be tested.

SUMMARY OF THE INVENTION

The present invention provides a test clip that may be used to make electrical connections with each of the leads of a PLCC located at all sides of the PLCC, thereby to facilitate electrical access to the respective PLCC leads by an external electrical device such as a cable, a circuit, test equipment, signal injecting equipment and signal analyzing equipment. Advantages afforded by the invention include, inter alia, assurance that the test clip will be properly positioned with respect to the PLCC and held to the PLCC in proper operative position once installed, zero insertion force so as to avoid possible damage to the PLCC and/or its mounting to a circuit board, and a footprint only slightly dimensionally larger than that of the PLCC which enables test clips to be installed on each of adjacent PLCC's located, for example, on 0.200 inch centers (lead to lead) or a test clip on one of two adjacent PLCC's located, for example, on 0.100 inch centers (lead to lead).

Accordingly, particular features that may be included in the test clip are the relatively close positioning of individual contacts corresponding to the spacing of the PLCC leads, the isolation of such contacts from each other, the test clip size enabling the same to be positioned with respect to a PLCC even with the latter in a close-packed arrangement on a printed circuit board or the like, and the facility with which the test clip may be positioned and retained on and removed from a PLCC. It is noted that one or more of these and other features hereinafter more particularly described may be included in a test clip or other clip connector having use with LCC's of various different profiles and/or lead patterns as well as with other types of electrical devices including, for example, DIP integrated circuit packages.

According to the invention, then, a test clip for a leaded chip carrier includes a plurality of electrical contacts for electrically connecting with respective leads of the leaded chip carrier, an electrically nonconductive body for supporting such contacts in spaced-apart positions, and a retaining mechanism for holding the test clip in operative position with respect to the leaded chip carrier.

According to another aspect of the invention, an electrical connector, e.g., a test clip, for a leaded electrical device comprises an electrically non-conductive body including socket means for receiving the device; a plurality of electrical contacts for electrically connecting with respective leads of the device, each contact having a mounting portion secured to said body and a contacting portion for electrically connecting with the respective lead, the contacting portion being normally in an open position out of electrical contact with the respective lead; and manually operable actuator means for urging the contacting portions of the contacts into electrical and mechanical contact with respective leads of the device.

According to still another aspect of the invention, an electrical connector, e.g., a test clip, for a leaded chip carrier (LCC) or other electrical device having plural leads on each of more than two sides of the device, comprises a plurality of electrical contacts for electrically connecting with respective leads of the device and an electrically non-conductive body for supporting the contacts in spaced apart positions, the body having a box-like nose portion for receiving therein the device, such nose portion being comprised of a plurality of wall-like separators for separating respective contacts along respective sides of the nose portion and for engaging at inside wall surfaces thereof respective sides of the device for locating the connector in operative position with respect to the electrical device.

More particularly and respecting particular features of the invention, the clip body is formed with a plurality of wall-like separators at each side thereof corresponding to a respective side of the leaded chip carrier (or similar device) along which leads are arranged in a row. The wall-like separators function to separate respective adjacent contacts, to locate the contacts in proper position relative to respective leads of the leaded chip carrier, and preferably to protect the contacts from damage. The wall-like separators also function properly to guide and locate the test clip in proper operative position with respect to the leaded chip carrier by collectively forming a box-like nose socket interiorly dimensioned to fit closely on the body of the leaded chip carrier with inside wall surfaces of the separators fitting between adjacent leads of the leaded chip carrier to engage respective sides of the carrier body.

Respecting other features of the invention, the contacts have mounting portions mounted to the clip body and contacting portions normally in an open position clearing the leads of the leaded chip carrier for zero force insertion. The contacts also have intermediate portions which are operated upon by a manually operated sliding cam member to force the contacting portions into mechanical and electrical contact with respective leads. The mounting portions of the contacts at each side of the clip body also project from an end of the chip body for coupling to another electrical device, such projecting or coupling portions of the contacts being located in staggered rows at respective different planes to minimize short circuits. A spacer may also be provided between the outer or endmost plane of contact coupling portions further to minimize the possibility of short circuits.

Respecting still other features of the invention, the retaining mechanism includes plural latching arms each pivoted at one end to the clip body and having at their outer ends respective inwardly projecting teeth for engaging the underside of the LCC at respective corners thereof. The latching arms, normally biased outward for positioning of the test clip on the LCC, are movable inwardly to hook the teeth beneath the LCC body by a manually operated sliding cam member and preferably the same cam member as that used to actuate the contacts.

To the accomplishment of the foregoing and related ends, the invention, then, comprises the features hereinafter fully described and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIG. 1 is an isometric view of a test clip according to the invention shown in exploded relation to a plastic leaded chip carrier (PLCC) to which the test clip may be connected;

FIG. 2 is a top plan view of the test clip of FIG. 1;

FIGS. 3A and 3B are broken continuations of a longitudinal (axial) sectional view of the test clip taken substantially along the line 3—3 of FIG. 2 and illustrating, respectively, the normal and actuated positions of a manually operable slide actuator of the test clip;

FIGS. 4A and 4B are broken continuations of another longitudinal (axial) sectional view of the test clip taken substantially along the line 4—4 of FIG. 2 illustrating, respectively, the normal and actuated positions of the slide actuator;

FIG. 5 is a transaxial sectional view through the test clip taken substantially along the line 5—5 of FIGS. 3A and 3B; and FIG. 6 is a fragmentary view of an alternative latching arm.

DETAILED DESCRIPTION

In the following detailed description reference will be made to a test clip having particular use with a plastic leaded chip carrier (PLCC), for according to the preferred embodiment and best mode of the invention, the device thereof is intended for use to test the operability of and the functions of a PLCC and/or other devices to which the PLCC may be connected. However, it will be appreciated that a device according to the invention, such as an electrical clip connector including one or more features of the invention, may be used with devices other than PLCC's, with LCC's of different types than that herein disclosed and illustrated, and other devices as well, and for electrical connection purposes that are other than testing purposes. References to a PLCC are intended to be exemplary references to a device to which the test clip (electrical connector) of the invention may be connected. However, respecting a test clip according to the preferred embodiment and best mode of the invention, the PLCC or similar device has leads located along each of more than two sides and particularly four sides of the PLCC to which the test clip contacts may be connected as hereinafter described. Also, reference to a lead herein generally may be construed as a reference to an electrically conductive member, such as a lead, contact or terminal associated with the PLCC or other electrical (electronic) device to which the test clip (electrical connector) of the invention may be connected. References to electrical and to electronic are used equivalently herein.

Referring now in detail to the drawings and initially to FIG. 1, a test clip according to the invention is designated generally by reference numeral 10. The test clip 10, according to the preferred embodiment and best mode of the invention, is intended to facilitate electrical access to respective leads of a plastic leaded chip carrier (PLCC), as when the PLCC is surface mounted to a printed circuit board. A PLCC, indicated generally at 11, has a generally square configuration in top plan view with leads 13 arranged in groups respectively along the four sides of the PLCC body 14 of electrically non-conductive plastic or plastic-like material which encapsulates a circuit chip electrically connected to the leads 13. Each lead 13 has a side portion 15 extending out of and downwardly along the respective side of the plastic body 14 and a reversely turned bottom portion 16 exposed at the bottom of the package as for connection to a respective solder land on a printed circuit board 17 (FIGS. 3A and 3B).

In FIG. 1, the test clip 10 can be seen to include a plurality of electrical contacts 20 for electrically connecting with respective leads 13 of the PLCC 11, an electrically non-conductive body 21 for supporting the contacts 20 in spaced-apart positions and for locating the test clip with respect to the PLCC, a retaining mechanism 22 for holding the test clip in operative position with respect to the PLCC when installed thereon, and a contact/retainer actuating mechanism 23. In the illustrated test clip, five contacts 20 are located on each side of the body 21 for respective electrical connection to the five leads 13 at the respective side of the PLCC. Preferably the contacts 20 are closely packed so that generally linear contacts may be used to effect electrical connections with the leads 13 of the PLCC which leads may be positioned, for example, on 0.050 inch centers along each side of the PLCC.

The clip body 21 preferably includes a main body part 30 of electrically non-conductive material and a head part or crown 31 also of electrically non-conductive material. Preferably both body parts 30, 31 are molded from plastic or plastic-like material, e.g., polyester, acetyl or polyphenylene sulfide (PPS), and the plastic or plastic-like material may be glass filled for rigidity and dimensional stability.

As seen in FIGS. 2-4, the main body part 30 has an elongated solid core portion 34 which, in the illustrated test clip, is generally square in cross-section as best seen in FIG. 5. The core portion 34 terminates at its upper end, as viewed in FIG. 3, in a dimensionally reduced tongue portion 35. The tongue portion 35 is press-fitted, snap-fitted, welded or otherwise suitably secured in a center hole 36 of the crown 31. In this manner, the main body part and crown are securely joined together to form the clip body 21 while the two-part construction facilitates assembly of the test clip as discussed hereinafter.

With particular reference to FIGS. 1, 3 and 5, the main body part 30 also includes at each side thereof a plurality of wall-like separators consisting of two laterally outer or corner separators 40a and intermediate separators 40b that are integrally molded with the core portion 34. Each adjacent pair of separators at each side of the main body part are laterally spaced to accommodate therebetween, separate, locate and guide a respective contact 20 for alignment with a respective lead 13 of the PLCC 11. More particularly, the separator walls serve to locate the contacts at a center-to-center spacing coinciding with the center-to-center spacing between leads of the device, particularly at the contacting portions 41 of the contacts.

The separators 40a and 40b extend the length of the core portion 34 and beyond to form a nose 45 of the test clip 10 at the end thereof opposite the crown 31. As seen in FIG. 3, each separator has a guide portion 46 extending from the crown 31 to an outwardly enlarged intermediate portion 47 from which depends a finger-like nose end portion 48 that is outwardly offset in relation to the guide portion 46. The nose end portions 48 of the separators collectively give the nose 45 what may be termed an open-ended box-like shape which is interiorly sized to fit over the correspondingly shaped body 14 of the PLCC 11. As is preferred, the depending nose end portions 48 at each side of the clip body are held in laterally spaced relation by respective spacer walls 49 which join the nose end portions together adjacent their outer side surfaces 50. As best seen in FIG. 3, each spacer wall 49 has a thickness substantially less than the depth of the respective nose end portions preferably by an amount which enables the contacting portions 41 of the contacts 20 to be positioned outwardly of the inside wall surfaces 51 of adjacent nose end portions as seen in FIG. 3A.

In the illustrated test clip for the PLCC 11 having five leads per side, there are four intermediate separators 40b at each side of the clip body forming along with the respective corner separators 40a five longitudinally extending slots for the five contacts 20 at each respective side of the clip body. The intermediate separators 40b are of a narrow width permitting close lateral packing of the contacts 20 at a center-to-center spacing equal the spacing of the leads of the PLCC at corresponding sides.

At its nose end portion 48, each intermediate separator 40b has an integral, inwardly projecting spacer 53. Each spacer 53 is sized to fit in the space between respective adjacent leads 13 of the PLCC 11 for engagement at inside wall surfaces 54 with the respective sides of the PLCC body 14. The provision of the reduced width spacers 53 allows the remaining portions of the intermediate separators to be of greater width over the lengths thereof for greater rigidity and strength and for better locating and guiding of the contacts 20 therebetween. Although not shown, the corner separators 40a may be recessed at the laterally inner surfaces of their nose end portions so as to clear the respective laterally outermost leads of the PLCC.

The inside wall surfaces 54 of the spacers 53 collectively define a socket-like space for close fitted receipt of the PLCC 11. The inside wall surfaces 54 engage respective side walls of the PLCC body 14 laterally to center the test clip with respect to the PLCC. As seen in FIG. 3, the upper portions of the side walls of the PLCC body 14 may have a slight taper with respect to the center axis of the PLCC in which case the inside wall surfaces 54 of the spacers also may be correspondingly tapered for surface area rather than line contact for more positive locating of the test clip with respect to the PLCC. The nose 45 of the test clip also has a height (axial depth) sufficient to accommodate the PLCC in the socket-like space preferably with the bottom of the core portion 34 being spaced from the top surface of the PLCC as for heat dissipation purposes.

The nose end or finger portions 48 of the separators 40a and 40b also have coplanar distal end surfaces 60 which may engage, for example, the facing surface 61 of the printed circuit board 17 to which the PLCC 11 is mounted so as to locate longitudinally (axially) the test clip 10 with respect to the PLCC. Inwardly of the end surfaces 60, the nose end portions may have inclined guide surfaces 62 and the spacers 53 may have rounded guide surfaces 63, as seen in FIG. 3, which serve to guide the nose 45 of the test clip to a laterally centered position with respect to the PLCC at which position the test clip may then be moved axially down over the PLCC with the inside wall surfaces 54 of the spacers engaging respective side walls of the PLCC to center the test clip with respect to the PLCC before the contacts 20 are engaged in the below discussed manner.

As illustrated at the lower left in FIG. 3A, the test clip 10 may be stacked with another test clip 10' on 0.200 inch centers, i.e., installed on adjacent PLCC's mounted to a circuit board with adjacent parallel rows of leads at a 0.200 inch center-to-center spacing. In this regard, the outer side surfaces 50 are spaced from the respective inside spacer surfaces 54 by a distance no greater than one-half the distance between adjacent sides of the PLCC bodies 14 and 14'. Considered otherwise, the test clip may have a maximum side dimension that exceeds the corresponding maximum side dimension of the PLCC body by no more than the spacing between adjacent parallel sides of the PLCC bodies. As will also be appreciated, a thusly configured test clip may be installed on one of two adjacent PLCC's located closer together as at 0.100 inch centers without interference with the other PLCC.

Referring now more particularly to the electrical contacts 20, each contact can be seen in FIG. 3 to include the above referenced contacting portion 41, an intermediate portion 66, and a mounting portion 67. The reference numeral 67 is suffixed by the letters "c" and "d" to differentiate between the mounting portions of alternating contacts which differ in configuration while the other portions of the contacts are of like configuration, as is preferred. The contacts may be 0.025 inch square with the contacting portions 41 preferably being coined down such that they are more flexible in bending than the other portions of the contacts.

The mounting portion 67c, 67d of each contact 20 may have the crown 31 molded thereabout or, as shown, may be fitted and held as by a press fit in a respective passage in the crown. Also, the mounting portions 67c, 67d of the contacts extend beyond respective axially and inwardly/outwardly stepped top surfaces 69c and 69d of the crown to form respective coupling portions 70c and 70d for electrically coupling with an electrically conductive member, such as a contact, lead or terminal of another electrical device (not shown). As is preferred, the coupling portions 70d and mounting portions 67d of the respective contacts are essentially straight line continuations of the respective intermediate portions 66. On the other hand, the mounting portions 67c of the respective other contacts are bent to offset outwardly the respective coupling portions 70c with respect to the coupling portions 70d as seen in FIG. 3. To permit insertion of the thusly bent mounting portion into the crown, the crown is provided with respective slots 72 at its underside to accommodate the outwardly stepped dimension of the mounting portions 67d. If desired, the passages in the crown for the contacts may be provided by slots in respective sides of the crown extending from the bottom of the crown to respective top surfaces 69c, 69d to permit the contacts to be laid into place and then held in place as by a press fit and/or barbs on the contacts.

In the illustrated preferred embodiment, the coupling portions 70c of every other contact 20 at each side of the test clip are in a row that is located laterally outwardly from and at a different plane or region along the axis of the clip body 21 than the row of the coupling portions 70d of the other contacts 20 at the respective side. Preferably, the coupling portions 70c, 70d extend equal distance from the respective top surfaces 69c, 69d with the coupling portion 70c preferably terminating at or short of the plane of the top surface 69d.

The indicated staggering of the coupling portions 70c, 70d of relatively adjacent contacts serves to reduce the possibility of short circuits as during probing or connection with another electrical device. The possibility of short circuits also may be reduced by the provision of a spacer 75 extending from the top surface 69c centrally of the coupling portions 70c. Respecting a further benefit of the staggered arrangement, the coupling portions in each row thereof at respective sides of the test clip may have a center-to-center spacing greater than that of the leads of the PLCC or other device to which the test clip is connected and, in the illustrated embodiment, twice the center-to-center spacing bwtween the leads of the PLCC. For a PLCC with a 0.050 inch center-to-center spacing of the leads, the coupling portions in each row accordingly will have a 0.100 inch center-to-center spacing which is a standard spacing for many electrical connectors such as cable end terminations which may, for example, be plugged onto the coupling portions in a respective row thereof.

The intermediate portions 66 of the contacts 20 extend generally longitudinally along respective sides of the clip body 21 between relatively adjacent separators 40 which guide the intermediate portions during flexing or bending thereof. Flexing or deflecting of the contacts towards the respective side of the core portion 34 is obtained by a slide actuator 80 of the control/retainer actuating mechanism 23. As seen in FIG. 5, the slide actuator 80 is generally square in top plan view and circumscribes the intermediate portions 66 of the contacts. The slide actuator is formed of non-conductive material such as plastic that may be molded about a relatively rigid insert such as a metal band 81 which serves to dimensionally stabilize and rigidify the slide actuator. Preferably, the material of the slide actuator has a low coefficient of friction (lubricity), and such, for example, may be polyester, acetyl or polyphenylene sulfide (PPS) with Teflon and/or carbon fiber fillers.

As seen in FIGS. 3 and 5, the slide actuator 80 has inside wall surfaces which slide on the outer wall surfaces of the separators 40 at the guide portions 46 thereof at respective sides of the clip body 21. The inside wall surfaces of the slide actuator 80 preferably are grooved to form slots 85 aligned with and corresponding in width to respective slots 86 formed between adjacent separators 40 of the main body part 30. Accordingly, the slots 85 formed in the sliding cam member and the slots 86 formed between adjacent separators cooperate to locate and guide the respective intermediate portions 66 of the contacts 20.

As best seen in FIGS. 3A and 3B, the outer side surfaces 88 of the slide actuator 80 preferably are coplanar with respective outer side surfaces 89 of the crown 31 and respective outer side surfaces 50 of the separators 40 at their intermediate and nose end portions 47 and 48. Accordingly, the slide actuator is confined, as is the crown, within a longitudinal projection of the footprint of the nose 45 of the test clip in relation to the printed circuit board 17 having mounted thereon the PLCC 11 to be tested. As also seen in FIGS. 3A and 3B, the slide actuator has an axial length less than the spacing between the bottom surface 90 of the crown and the upper surface or ledge 91 of the intermediate portion 47 of each separator 40 which extends outwardly beyond the guide portion 46 of such separator. Accordingly, the slide actuator can be slid along the guide portions 46 of the separators 40 between its normal and actuated positions shown in FIGS. 3A and 3B, respectively while the bottom surface 90 and ledge 91 serve as positive stops for the slide actuators.

As seen in FIG. 3A, the intermediate portion 66 of each contact 20, in its relatively unflexed or normal condition, is bent outwardly away from the respective side of the clip body core portion 34, as at an angle of about 15° to the axis of the test clip, and then reversely relatively gradually curved or bent to the contacting portion 41 of the respective contact. As seen in FIG. 3A, the relatively sharp bend at 93 is located proximate the lower end of the slide actuator 80 when in its normal position such that the reversely and gradually curved extent of the intermediate portion will reside in the path of the slide actuator. Accordingly, as the slide actuator is slid along the clip body from its normal position of FIG. 3A to its actuated position of FIG. 3B, the bottom walls 94 of the slots 85 therein will engage the outer surfaces of the respective intermediate portions of the contacts progressively to urge (cam) the same inwardly while being guided by the relatively adjacent separators. As the intermediate portions are thusly bent or flexed inwardly, the contacting portion 41 of the contacts will be correspondingly moved inwardly and also shifted longitudinally downwardly as the slide actuator tends to straighten and hence axially lengthen the normally bent intermediate contact portions 66 as seen in FIG. 3B. When the slide actuator finally abuts the separator ledges 91, the contacting portions will have been forced into electrical and mechanical engagement with respective leads 13 of the PLCC 11. Respecting reverse movement of the slide actuator from its actuated to its normal position, the intermediate contact portions will spring back to their original condition seen in FIG. 3A. As is preferred, the lower portion of each bottom wall 94 of the slots 85 is sloped outwardly as seen at 95 for smooth engagement with the respective contact. Also, it will be appreciated that the slide actuator deflects the contacts such that they apply a normal force to respective leads as well as a wiping force.

The contacting portion 41 of each contact 20 preferably is relatively straight and may have at the remote end thereof an outwardly bent tab 98. The tab 98 functions to avoid a sharp end at the end of the contacting portion which could damage a lead of the PLCC and also to protect the contact itself by preventing the end of the contacting portion from biting into a lead and becoming lodged therein as during the below discussed wiping action. In the least flexed or normal condition of each contact illustrated in FIG. 3A, the contacting portion 41 preferably is located outwardly beyond the surfaces 51 of adjacent nose end portions 48 in an open position. This ensures that the contact will not contact a lead of the PLCC until such time that the slide actuator 80 is operated to move the contacting portion inwardly against the respective lead. In this regard, it is noted that preferably only the spacers 53 will fit between the relatively adjacent leads of the PLCC.

As previously noted, operation of the slide actuator 80 will move the contacting portions 41 of the contacts 20 inwardly towards respective leads of the PLCC at each side thereof. As the slide actuator moves to its actuated position of FIG. 3B, the contacts will be urged into electrical and mechanical contact with respective leads of the PLCC. Also, the contacts will be caused to wipe across the leads since, as noted above, the slide actuator will tend to straighten the bent intermediate portions 66 of the contacts and thus cause the contacting portions to slide downwardly on the leads of the PLCC.

It should now be apparent that the test clip 10 provides for essentially zero insertion force on the PLCC 11. With the slide actuator 80 in its normal unactuated position of FIG. 3A, i.e., with the contacts in their open position, the test clip may be generally coaxially aligned with the PLCC 11 and then its nose 45 slipped down over the PLCC until the distal ends 60 of the separators 40 engage the printed circuit board 17 at which point the test clip will be properly positioned with respect to the PLCC. The slide actuator then may be manually slid downwardly along the clip body 21 to close the contacts, i.e., to cam the contacts inwardly to effect electrical and mechanical engagement of the contacts 20 with respective leads 13 of the PLCC. During such downward movement of the slide actuator, the resultant forces acting upon the clip body will be borne by the circuit board 17 rather than by the PLCC 11.

Further in accordance with the invention, the test clip 10 further comprises the above referenced retaining mechanism 22 which serves to hold the test clip in proper operative position with respect to the PLCC 11 once installed thereon as above noted. As best seen in FIGS. 2 and 4, the retaining mechanism 22 includes latching arms 100 located at respective corners of the clip body 21. The latching arms 100 are of electrically nonconductive material to avoid the possibility of shorts. The material of the latching arms should also have high strength and stiffness such as a ceramic or ceramic-like material with aluminum oxide material being preferred.

The upper or mounting end 102 of each latching arm 100 is received in a respective diagonal corner slot 103 in the crown 31 and is secured in such slot as by a pivot pin or, as shown, detents 104 snapped into dimples at the sides of the slot for pivotal movement in a diagonal plane of the test clip. As seen in FIG. 2, a latching arm is provided at each corner of the clip body.

At its lower or gripping end 106 remote from its pivot 104, each latching arm 100 is provided with a jaw-like tooth 107 which protrudes inwardly from the bottom of the latching arm. The tooth 107 is sized to fit beneath the PLCC body 14 when spaced above the printed circuit board 17 by reason of the downward projection of the leads 13 mounted to the circuit board. When the latching arms are pivoted inwardly, the teeth thereof will engage the underside of the PLCC body at respective corners thereof to hold the test clip to the PLCC. On the other hand, the latching arms may be pivoted outwardly to clear the teeth with respect to the PLCC body for removal of the test clip.

Each latching arm 100 at its outer side is recessed as seen at 110 in FIG. 4 to form a narrower intermediate portion 111 which joins the mounting and gripping end portions 102 and 106. The intermediate portion 111 of each latching arm is located interiorly of the slide actuator 80 in a respective corner slot 112 thereof and has a length corresponding to the length of the axial path of the slide actuator. That is, the top and bottom surfaces 113 and 114 of the recess at the upper and lower ends of the intermediate portion of each latching arm may be essentially coplanar with the bottom surface 90 of the crown 31 and the ledge 91 of the separators 40, respectively.

The bottom surface 116 of each corner slot 112 of the slide actuator 80 extends normal to the respective diagonal. The latching arms 100 are biased outwardly by respective compression springs 118 (or other suitable resilient means, e.g., leaf springs or methane O-rings) retained as in a recess in the core portion 34 of the clip body 21 such that the outer side 119 of the intermediate portion 111 of the latching arm is biased outwardly to engage the wall 117 of the slide actuator 80. The outer side 119 of each latching arm has an outwardly sloping surface 120 on which the wall 117 slides to cam inwardly the latching arm until the slide actuator 80 aligns closest the nose of the clip body. At this point, the latching arms and slide actuator will frictionally engage to lock the slide actuator in its actuated position seen in FIG. 4B. The slide actuator will be held in such position until manually urged upwardly, i.e., towards the crown 31 of the clip body, the latching members then moving outwardly to their original position corresponding to that when the slide actuator is in its normal position seen in FIG. 4A.

When the slide actuator 80 is in its normal position of FIG. 4A, the gripping teeth 107 will be in an outer position enabling them to clear the sides of the PLCC body 14 at the corners thereof thereby to permit placement of the test clip on the PLCC 11 or removal therefrom. On the other hand, as the slide actuator is manually slid towards the nose 45 of the clip body, the latching arms will be pivoted inwardly with the gripping teeth fitting beneath the PLCC body at respective corners thereof. Accordingly, the gripping teeth will hold the test clip to the PLCC body, even after the latching arms have outwardly backed off slightly to seat the beads in the recesses at the fully actuated or locked position of the slide actuator. It also is noted that as the slide actuator is moved to its locked position of FIG. 4B, the contacting portions 41 of the contacts 20 will be moved inwardly to engage the leads 14 of the PLCC in the above described manner. When the slide actuator is in the FIG. 4B position, the over center cam function of the bead 117 and bump 120 will hold the slide actuator in place against the resilient force of the contacts trying to push upwardly the slide actuator.

The latching arms 100 alternatively may be made of a material less rigid than a ceramic material such as a plastic or plastic-like material. In this case, the gripping end of each latching arm may be formed as seen at 106' in FIG. 6. The gripping end 106' has formed therein an axially extending slot 125 which permits outward flexing of an inner tine-like portion 126 of the gripping end. Such outward flexing would allow the slide actuator to slide with only controlled limited force being applied to the PLCC at the teeth 107'.

Referring now to a manner of assembling the test clip, such is facilitated by the two-part construction of the test clip body 21 as above indicated. Before the crown 31 and main body part 30 are secured together, the contacts 20 may be press fitted or otherwise secured at their mounting portions 67 in the crown. The contacts may then be flexed inwardly to permit passage of the slide actuator 80 thereover. At the same time, the latching arms 100 may be positioned interiorly of the slide actuator and their mounting end portions fitted into the corner slots 103 in the crown for pivotal connection thereto. Thereafter, the main body part 30 may be inserted between the contacts and secured with the crown as aforedescribed. As the main body part is moved into final position in relation to the crown, care should be taken to ensure that the contacting portions 41 of the contacts are positioned inwardly of the spacer walls 49 if provided.

Although the invention has been shown and described with respect to a preferred embodiment, it is obvious that equivalent alterations and modifications will occur to others skilled in the art upon the reading and understanding of this specification. The present invention includes all such equivalent alterations and modifications, and is limited only by the scope of the following claims.

We claim:

1. An electrical clip connector for connecting conductive elements of an external device to conductive elements of a chip carrier or other electrical device having a generally rectangular body and plural conductive elements at each side of the rectangular body, comprising:

a generally rectangular arrangement of electrical contact means including a plurality of said contact means at each side of said rectangular arrangement for effecting electrical connection between conductive elements of the external device and conductive elements of the electrical device at a corresponding side of the electrical device;

body means for supporting said contact means in said rectangular arrangement, said body means having at least two depending wall means at respective opposed sides of said rectangular arrangement for receiving therebetween the electrical device, said two depending wall means including a plurality of wall-like separators for separating the contacts at the respective sides of said rectangular arrangement;

and retaining means for holding said connector to the electrical device, said retaining means including plural latching elements for gripping the electrical device, and means for moving said latching elements between first and second positions respectively for engaging and disengaging said latches with respect to the electrical device, and means for resiliently biasing said latching elements towards said second position.

2. A connector as set forth in claim 1, wherein said separators include reduced width, inwardly extending spacers sized to fit between adjacent leads of the electrical device for engagement with respective sides of the electrical device.

3. A connector as set forth in claim 1, wherein said body means includes four depending wall means at respective sides of said rectangular arrangement to receive therebetween the electrical device, each wall means including a plurality of wall-like separators for separating the contact means at the respective side of said rectangular arrangement and for engaging at inside wall surfaces a respective side of the electrical device for locating the connector in relation to the electrical device.

4. An electrical clip connector for connecting conductive elements of an external device to conductive elements of a chip carrier or other electrical device including a body having more than two sides and plural conductive elements at each one of more than two sides of the body, comprising:

a multi-sided arrangement of electrical contact means including a plurality of said contact means at each side of said multi-sided arrangement for effecting electrical connection between conductive elements of the external device and conductive elements of the electrical device at a corresponding side of the electrical device;

body means for supporting said contact means in said multi-sided arrangement, said body means having at least two depending wall means at respective opposed sides of said multi-sided arrangement for receiving therebetween the electrical device, said two depending wall means including a plurality of wall-like separators for separating the contacts at the respective sides of said multi-sided arrangement;

and retaining means for holding said connector to the electrical device, said retaining means including plural latching elements for gripping the electrical device and means for moving said latching elements between first and second positions respectively for engaging and disengaging said latches with respect to the electrical device, and means for resiliently biasing said latching elements towards said second position.

5. A connector as set forth in claim 4, wherein said separators include reduced width, inwardly extending spacers sized to fit between adjacent leads of the electrical device for engagement with respective sides of the electrical device.

6. A connector as set forth in claim 4, wherein said body means includes a depending wall means at each side of said multi-sided arrangement to receive therebetween the electrical device, each wall means including a plurality of wall-like separators for separating the contact means at the respective side of said multi-sided arrangement and for engaging at inside wall surfaces a respective side of the electrical device for locating the connector in relation to the electrical device.

* * * * *